United States Patent [19]

Ernyei et al.

[11] 4,255,727
[45] Mar. 10, 1981

[54] ELECTROMECHANICAL FILTERS

[75] Inventors: Herbert Ernyei; Etienne Langlois, both of Paris, France

[73] Assignee: Societe Lignes Telegraphiques et Telephoniques, Ste. Honorine, France

[21] Appl. No.: 920,115

[22] Filed: Jun. 28, 1978

[30] Foreign Application Priority Data

Aug. 4, 1977 [FR] France .................................. 77 23983

[51] Int. Cl.³ .................. H03H 9/46; H03H 9/50; H03H 9/52
[52] U.S. Cl. ................................. 333/197; 333/186; 333/198
[58] Field of Search ............................. 333/197–201, 333/186, 189

[56] References Cited

U.S. PATENT DOCUMENTS

| 3,858,127 | 12/1974 | Johnson | 333/198 |
| 3,986,151 | 10/1976 | Kanazawa et al. | 333/71 |
| 4,060,774 | 11/1977 | Ernyei | 333/71 |

OTHER PUBLICATIONS

Gunther et al.–"Mechanical Channel Filters Meeting CITT Specification", Proceedings of the IEEE, vol. 67, No. 1, Jan. 1977; pp. 102–108.
Johnson et al.–"Mechanical Filters-A Review of Progress" in IEEE Transactions on Sonics and Ultrasonics, vol. SU-18, No. 3, Jul. 1971; pp. 155–170.

Primary Examiner—Marvin L. Nussbaum
Attorney, Agent, or Firm—Kemon & Estabrook

[57] ABSTRACT

In an electromechanical filter, poles are obtained by interconnecting an electrical reactance between the input and output of the filter. It is shown that this impedance behaves as a mechanical bridge.

4 Claims, 5 Drawing Figures

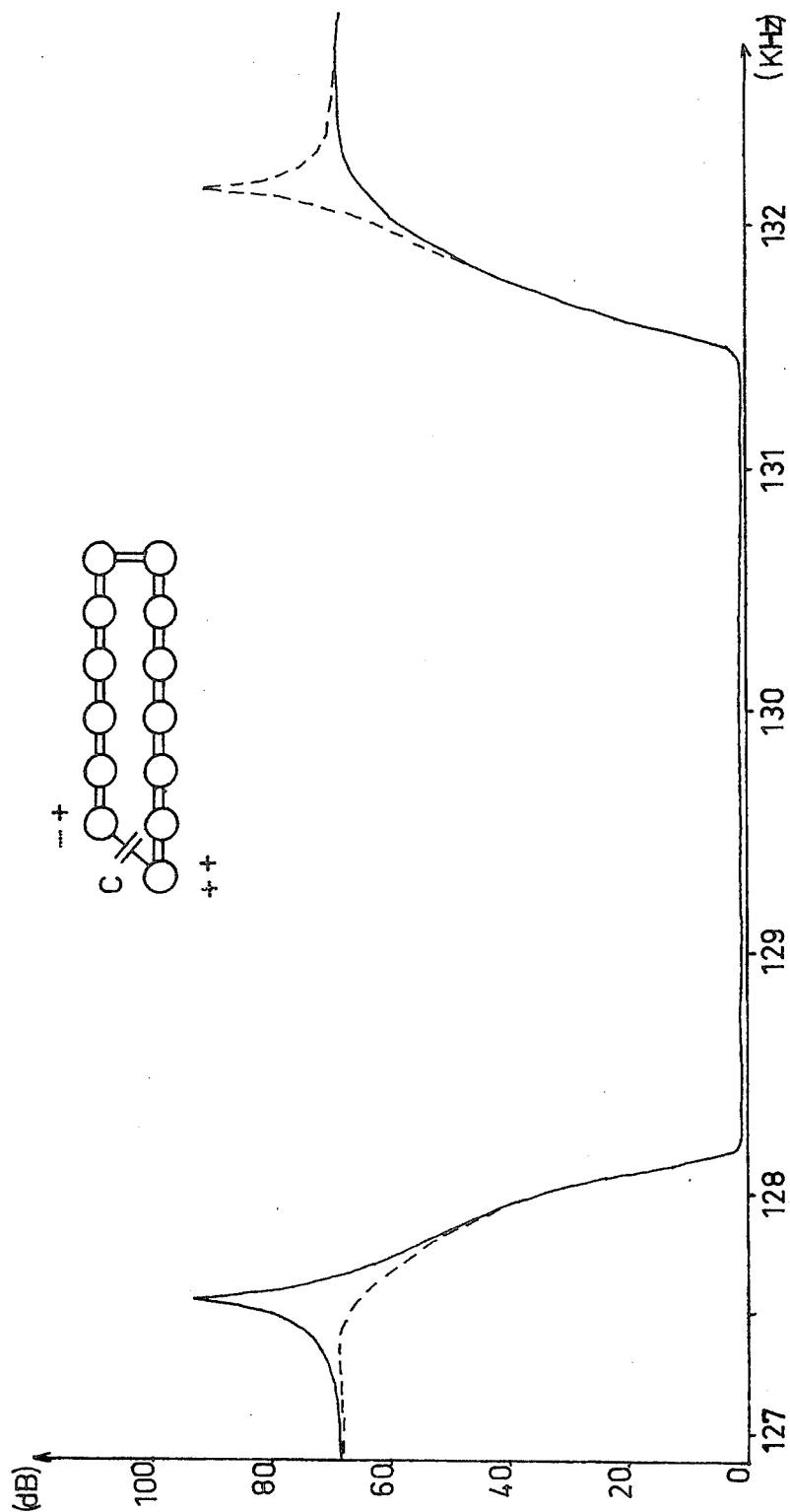

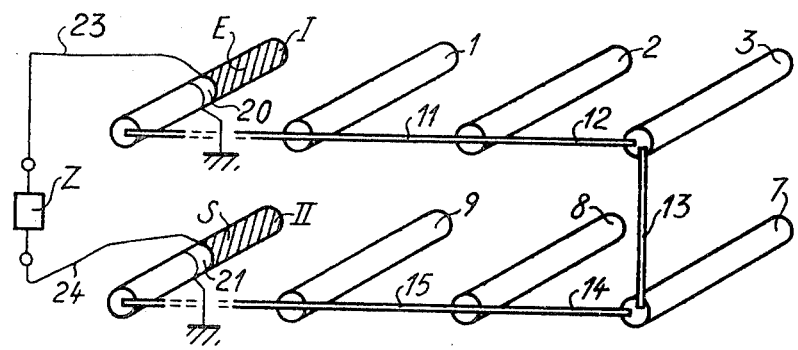
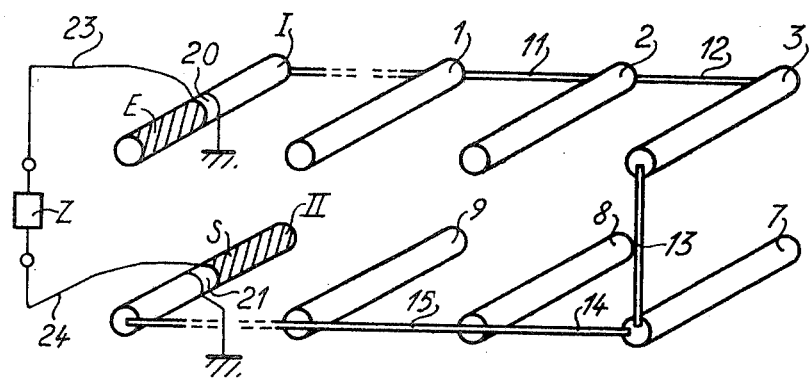

ELECTROMECHANICAL FILTERS

BACKGROUND OF THE INVENTION AND PRIOR ART

The present invention concerns electromechanical filters having at least one pole or attenuation maximum in the neighbourhood of the pass band, and it relates to a filter structure of this type which is of simple mechanical construction, which provides easy industrial production and which ensures high quality of the transmission in the band.

Electromechanical filters consist essentially of a set of resonators, generally metal bars of cylindrical form, of which the dimensions are made such that, in a chosen mode of vibration, the said bars constitute circuits tuned to a preselected frequency. These bars are interconnected by means of couplers which generally consist of metal rods vibrating in a preset mode and providing mechanical coupling between adjacent resonators. One of the resonators, called the input resonator, is associated with a transducer which changes an electrical input signal into a mechanical displacement to excite the said bar into the selected mode of vibration; likewise, a second bar of the set, called the output resonator, is associated with a second transducer which effects the reverse conversion. The transducers are connected to the input and output terminals respectively of the filter. Such filters have been the subject of many works which have been abundantly described in the technical press and of patents. Such are the following U.S. Pat. No. 4,060,774 filed on June 14th, 1976 for: "Electromechanical band-pass filter for high frequencies" and U.S. Patent 4,100,506 filed on Nov. 17th, 1976 for: "Electromechanical filter" assigned to same Assignee as the present application.

It is known (see notably the article by R. A. JOHNSON, published in the report of the Symposium on Circuits and Systems Newton-April 1975, sponsored by the Institute of Electrical and Electronic Engineers), to create poles in the transmission characteristic by disposing, between non-adjacent bars, auxiliary couplers which will be termed "bridges" in the following text. The work which forms the subject of the aforesaid publication can be summed up as follows:

| Number of bars between ends of the bridge | Mechanical length of the bridge | Poles close to the transmitted band |
|---|---|---|
| 2n | $3\lambda/4 + P\lambda$ | 1 pole on each side of the band |
| 2n | $\lambda/4 + P\lambda$ | phase corrector (2 conjugate complex poles) |
| 2n − 1 | $3\lambda/4 + P\lambda$ | 1 pole of frequency lower than the band |
| 2n − 1 | $\lambda/4 + P\lambda$ | 1 pole of frequency higher than the band | where n is a positive integer other than zero p is a positive integer or zero, and $\lambda$ is the wavelength at the central frequency of the filter in the mode of vibration chosen for the bridge.

In regard to the construction, it is important to minimize the length of the bridges in order to eliminate any danger of irregularity being introduced into the band pass by any natural frequency of stray oscillation of the said bridge. It is therefore desirable to limit the length of the bridge to one quarter of three-quarters of the wavelength in the mode of vibration used (p=0).

The U.S. application Ser. No. 862,906 filed on Dec. 21st, 1977 for: "Electromechanical filter structure" now U.S. Pat. 4,163,960 and assigned to the same assignee discloses filters based on the foregoing study and means for improving the characteristic of these filters in the pass band.

BRIEF SUMMARY OF THE DISCLOSURE

The present invention concerns an electromechanical filter structure based on the aforesaid study, wherein at least a part of the poles is produced by electrical means. According to a basic feature of the invention at least one pole of the transmission characteristic is obtained by the use of a reactance connected between the input circuit and the output circuit. Such a reactance performs the function of a $\lambda/4$ or $3\lambda/4$ bridge (cf. above table) depending upon whether it is connected to the electrodes of like polarity of the two transducers or not. The influence of this reactance on the characteristic can be deduced from the foregoing table when the number of resonators of the filter is known. When the filter already has a bridge consisting of a mechanical coupler disposed between non-adjacent resonators, the number of resonators to be taken into account for defining the electrical bridge is that of the non bridged resonators.

BRIEF DESCRIPTION OF THE FIGURES

The invention will be more readily understood from the following description and from the accompanying figures which are given by way of non limiting illustration and in which:

FIG. 3 shows the characteristics of a filter having an odd number of bars and a capacitive bridge.

FIGS. 4 and 5 show alternative embodiments of the terminations of the filter and correspond to a two plane stacking of the resonators according to the teachings of U.S. Pat. No. 4,163,960.

DETAILED DESCRIPTION

Figure 1:
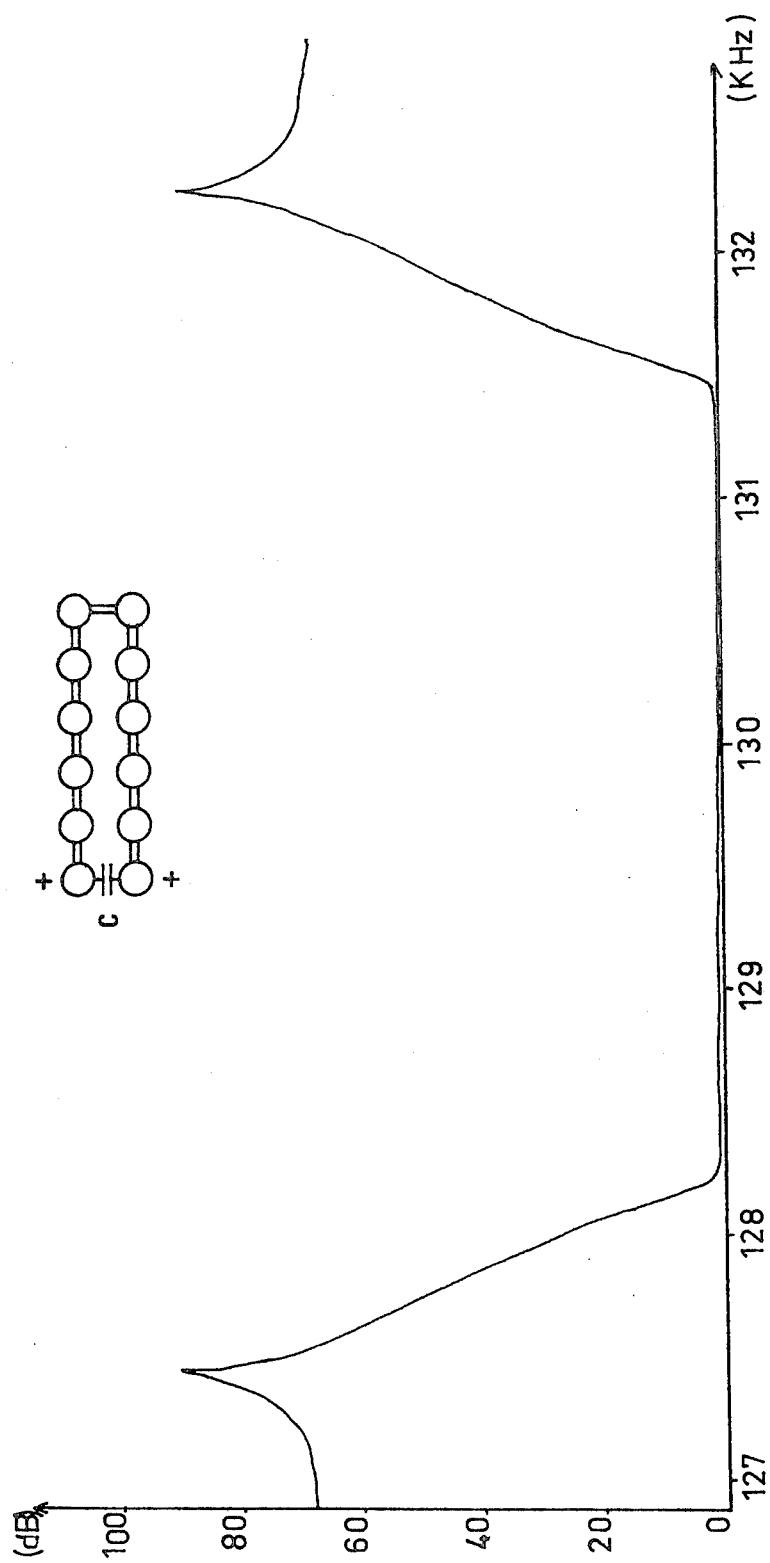
FIG. 1 is the characteristic curve of a filter having an even number of bars and a capacitive bridge.

The upper part of FIG. 1 shows the structure of the filter whose attenuation characteristic curve is illustrated in FIG. 1. As is apparent, the filter consists of twelve resonators distributed along two parallel planes as described in the U.S. application Ser. No. 862,906 filed on Dec. 21st, 1977, in which said resonators are interconnected by couplers. The resonators vibrate longitudinally and the couplers vibrate in flexure. In accordance with the present invention, there is disposed between the two outermost resonators a bridge consisting of a capacitor C, whose value is defined as hereinafter explained. The two "plus" signs appearing close to the transducer resonators are intended to specify that the connections between the coupling capacitor C and the resonators are made on the two parts of each of the said resonators connected at the extremities of the two transducers positively biased. The same characteristic can be obtained by connecting the capacitor serving as a bridge with the parts of the resonators connected to the extremities of the transducers negatively biased. As is apparent, the characteristic has two real poles situated outside the pass band of the filter and disposed symmetrically about the central frequency of the pass band. Referring to the foregoing table, the capacitor behaves as a 3 $\lambda/4$ bridge.

Figure 2:
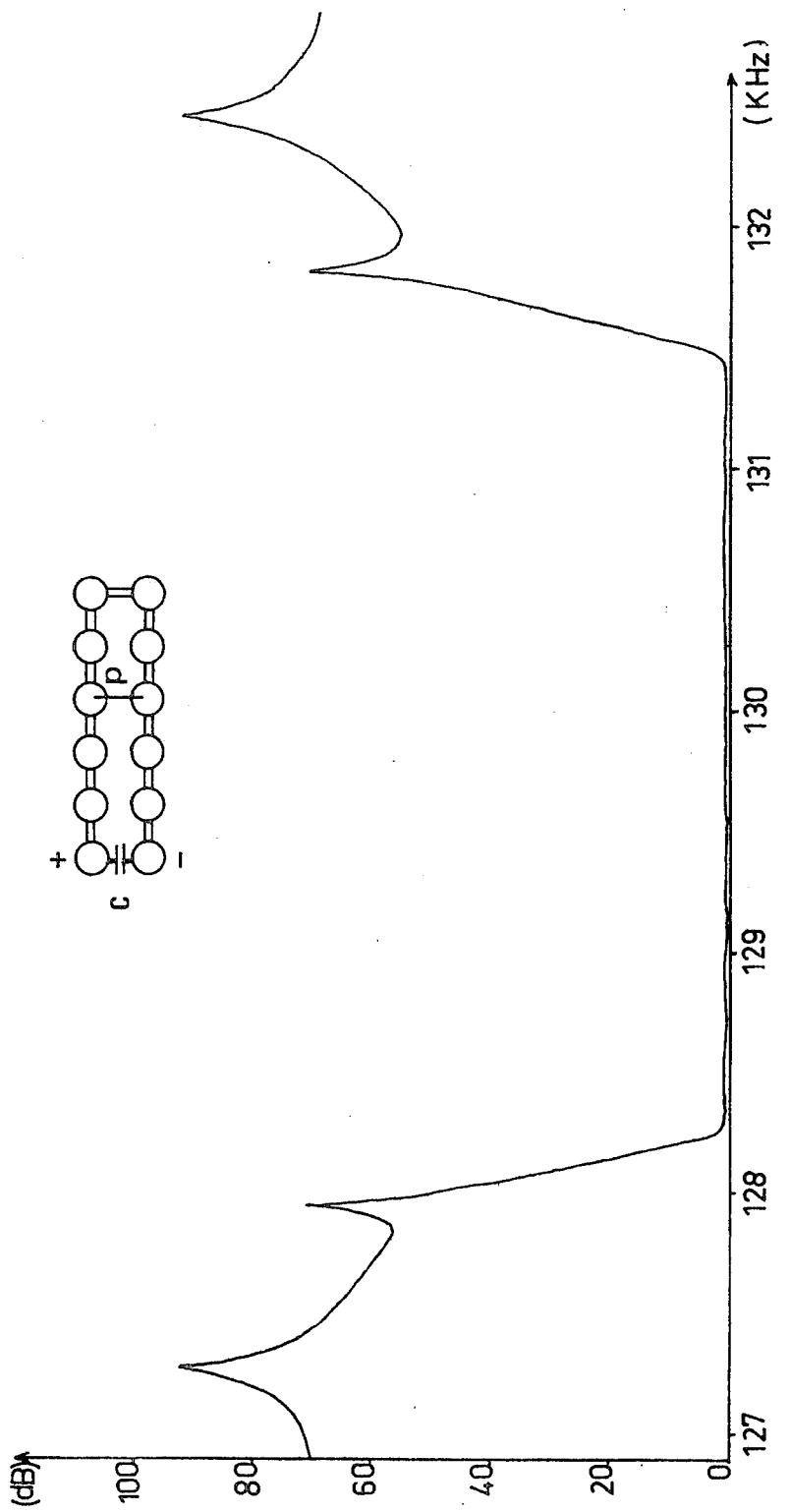
FIG. 2 is the characteristic curve of a filter comprising a mechanical bridge and a capacitive bridge.

FIG. 2 corresponds to the characteristic of a filter consisting of twelve resonators coupled together and distributed as before a long two parallel planes and having in addition a mechanical bridge P over four resonators 3 $\lambda/4$ long, associated with a capacitive bridge C between the transducer resonators and connected to those ends of the latter which are connected to the terminals of opposite polarity of the transducers. The characteristic shows four real poles disposed two-by-two symmetrically about the central frequency of the pass band. One of the pairs of poles is due to bridge P according to the first line of the foregoing table, and the second pair of real poles is obtained by the addition of a capacitive bridge C.

The characteristics illustrated in FIG. 3 correspond to a filter structure having thirteen longitudinally vibrating resonators which are coupled together and disposed in two parallel planes associated with a capacitive bridge C connecting the two transducer resonators. The solid-line curve corresponds to the characteristic obtained when the capacitor is connected between the parts of the terminal resonators associated with the extremities of like polarity of the two transducers. The chain-lined curve corresponds to the characteristic obtained by connecting the capacitive bridge C between the parts of the two transducer resonators connected to the extremities of opposite polarities of the two transducers. These characteristics correspond respectively to the last two lines of the foregoing table.

The filter comprises resonators 1, 2, 3, 7, 8, 9 interconnected by mechanical couplers 11, 12, 13, 14, 15 respectively and end resonators shown as I and II on both Figures. Transducers with their responsive piezoelectric wafers are shown as 20 and 21 respectively. They are welded at midlength of the end resonators after cutting into two halves. As shown in FIGS. 4 and 5 one end face of each of said transducers 20 and 21 is electrically connected to a reference potential (earth potential). The outer end faces of transducers 20 and 21 are electrically connected to two leads 23 and 24 respectively, said two leads serving as two terminals for the filter. An electrical reactance (Z) is connected between the non-earthed faces of the input (E) and output (S) transducers.

The choice of the value of the reactance constituting the bridge is made, with due regard to the frequency $F_p$ of the pole or poles which it is desired to obtain, in the following manner:

The article by Mr. ERNYEI published in Conference Record of the 1976 IEEE International Conference on acoustic speech and signal processing - Philadelphia - under the title "Theoretical aspect of electromechanical transducers", page 779, shows that the behaviour of the transducer may be expressed by a matrix which can be broken up into a produce of the matrix of a gyrator and of those of resonant and anti-resonant circuits. The breaking up can also cause to appear a matrix equivalent to that of a coupler of a length of $\lambda/4$ (to within the phase shift) and matrices equivalent to those of resonators of a length of $\lambda/2$. The coupling capacitance (or reactance) may be regarded as one of the elements of the equivalent diagram of a 3 $\lambda/4$) (or $\lambda/4$) bridge. This equivalence make it possible to deal with the electrical coupling as a mechanical bridge over the whole of the structure. The mode of calculation of the characteristics of this bridge is given in the U.S. application Ser. No. 862,906 filed on Dec. 21st, 1977. The electromechanical equivalence makes it possible to determine the value of the capacitance or of the reactance which generates the desired poles.

The foregoing examples concern filter characteristics exhibiting real poles. It is to be understood that structures having an even number of resonators can be used in the construction of phase correctors having two conjugate complex poles (cf. second line of the table), using the reactive bridge of the invention. It is more economic to produce the bridge with the aid of a capacitor than with the aid of an inductor and this explains the limitation of the examples to designs provided with a capacitive bridge.

What we claim:

1. An electromechanical multi-resonator filter comprising:
   a set of mechanical resonators interconnected by mechanical couplers;
   two transducers, each including one piezoelectric wafer loacted between two tuning rods to constitute two resonators of said set each of which are mechanically coupled to only one other resonator of the set, respectively, one end surface of each of said wafers being electrically connected to a reference potential and the other end surface of each of said wafers being electrically connected to a lead acting as a terminal for said filter; and
   an electrical reactance connected between said filter terminals, the mechanical equivalent of said reactance corresponding to a mechanical circuit which behaves as an odd number of quarter wavelengths of the mechanical wave in said resonators.

2. An electromechanical filter according to claim 1 wherein said filter terminals are of the same polarity with respect to said reference potential.

3. An electromechanical filter according to claim 1 wherein said filter terminals are of the opposite polarity with respect to said reference potential.

4. An electromechanical filter according to claim 1 wherein a mechanical bridge is connected over part of the resonators.

* * * * *